(12) United States Patent
Arena et al.

(10) Patent No.: US 7,022,593 B2
(45) Date of Patent: Apr. 4, 2006

(54) SIGE RECTIFICATION PROCESS

(75) Inventors: Chantal J. Arena, Mesa, AZ (US);
Pierre Tomasini, Phoenix, AZ (US);
Nyles W. Cody, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 161 days.

(21) Appl. No.: 10/800,417

(22) Filed: Mar. 11, 2004

(65) Prior Publication Data

US 2004/0219767 A1 Nov. 4, 2004

Related U.S. Application Data

(60) Provisional application No. 60/454,851, filed on Mar. 12, 2003.

(51) Int. Cl.
*H01L 21/20* (2006.01)
(52) U.S. Cl. .................. 438/494; 438/496; 438/507; 438/770
(58) Field of Classification Search ............ 438/493, 438/494, 496
See application file for complete search history.

(56) References Cited

U.S. PATENT DOCUMENTS

| 3,602,778 | A | 8/1971 | Ura et al. |
| 3,720,877 | A | 3/1973 | Zarowin |
| 3,729,645 | A | 4/1973 | Redington |
| 3,737,739 | A | 6/1973 | Blakeslee et al. |
| 3,984,718 | A | 10/1976 | Fein et al. |
| 3,984,857 | A | 10/1976 | Mason |
| 3,985,590 | A | 10/1976 | Mason |
| 4,461,820 | A | 7/1984 | Shirai et al. |
| 4,656,013 | A | 4/1987 | Hiai et al. |
| 4,699,892 | A | 10/1987 | Suzuki |
| 4,786,574 | A | 11/1988 | Shirai et al. |
| 4,803,186 | A | 2/1989 | Chen et al. |
| 4,857,270 | A | 8/1989 | Maruya et al. |
| 4,868,014 | A | 9/1989 | Kanai et al. |
| 4,983,274 | A | 1/1991 | Chen et al. |
| 5,037,775 | A | 8/1991 | Reisman |
| 5,112,439 | A | 5/1992 | Reisman et al. |
| 5,281,274 | A | 1/1994 | Yoder |
| 5,281,299 | A | 1/1994 | Escoffier et al. |
| 5,294,285 | A | 3/1994 | Kanai et al. |

(Continued)

FOREIGN PATENT DOCUMENTS

JP 62017004 1/1987

OTHER PUBLICATIONS

Takagi et al., "Device structure and electrical characteristics of strained-Si-on-insulator (strained-SOI) MOSFETs", Materials Science and Engineering B89 (2002), pp. 426-434.

(Continued)

*Primary Examiner*—Stephen W. Smoot
(74) *Attorney, Agent, or Firm*—Knobbe Martens Olson & Bear LLP

(57) ABSTRACT

A method for forming strain-relaxed SiGe films comprises depositing a graded strained SiGe layer on a substrate in which the concentration of Ge is greater at the interface with the substrate than at the top of the layer. The strained SiGe film is subsequently oxidized, producing a strain-relaxed SiGe film with a substantially uniform Ge concentration across the thickness of the film. The relaxed SiGe layer may be used to form a strained silicon layer on a substrate.

25 Claims, 3 Drawing Sheets

U.S. PATENT DOCUMENTS

| | | | |
|---|---|---|---|
| 5,316,958 | A | 5/1994 | Meyerson |
| 5,366,554 | A | 11/1994 | Kanai et al. |
| 5,482,557 | A | 1/1996 | Kanai et al. |
| 5,576,247 | A | 11/1996 | Yano et al. |
| 5,646,073 | A | 7/1997 | Grider et al. |
| 5,667,586 | A | 9/1997 | Ek et al. |
| 5,818,100 | A | 10/1998 | Grider et al. |
| 6,242,080 | B1 | 6/2001 | Kondo |
| 6,451,641 | B1 | 9/2002 | Halliyal et al. |
| 6,515,219 | B1 | 2/2003 | Kondo |
| 6,646,073 | B1 | 11/2003 | Farrer et al. |
| 6,709,901 | B1 | 3/2004 | Yamazaki et al. |
| 6,825,086 | B1 * | 11/2004 | Lee et al. ............... 438/294 |
| 2002/0168802 | A1 * | 11/2002 | Hsu et al. ............... 438/149 |
| 2002/0173130 | A1 | 11/2002 | Pomerede et al. |
| 2003/0010978 | A1 | 1/2003 | Burden |
| 2003/0111013 | A1 | 6/2003 | Oosterlaken et al. |
| 2003/0157787 | A1 | 8/2003 | Murthy et al. |
| 2003/0207127 | A1 | 11/2003 | Murthy et al. |
| 2003/0230233 | A1 | 12/2003 | Fitzgerald et al. |
| 2003/0235931 | A1 | 12/2003 | Wada et al. |
| 2005/0164473 | A1 * | 7/2005 | Liu et al. ............... 438/478 |

OTHER PUBLICATIONS

Lim et al., "*Dry thermal oxidation of a graded SiGe layer*", Applied Physics Letters, vol. 79, No. 22, Nov. 26, 2001, pp. 3606-3608.

Sugiyama et al., "*Fabrication of SiGe on Insulator Structure using Ge Condensation Technique*", Third International Conference on SiGe (C) Epitaxy and Heterostructures (ICSI3), Santa Fe, NM, Mar. 9-12, 2003, pp. 152-154.

Mizuno et al., "*Advanced SOI p-MOSFETs with Strained-Si Channel on SiGe-on-Insulator Substrate Fabricated by SIMOX Technology*", IEEE Transactions on Electron Devices, vol. 48, No. 8, Aug. 2001, pp. 1612-1618.

Mizuno et al., "*Electron and Hole Mobility Enhancement in Strained-Si MOSFET's on SiGe-on-Insulator Substrates Fabricated by SIMOX Technology*", IEEE Electron Device Letters, vol. 21, No. 5, May 2000, pp. 230-232.

Mizuno et al., "*Novel SOI p-Channel MOSFETs With Higher Strain in Si Channel Using Double SiGe Heterostuctures*", IEEE Transactions on Electron Devices, vol. 49, No. 1, Jan. 2002, pp. 7-14.

Tsutomu Tezuka, "*Strained Si- and SiGe-MOSFETs on SiGe-on-insulator (SGOI) substrates*", 2002 Japan Epitaxial Technology Symposium, "Advanced Substrate Engineering and Device Technology", Feb. 27, 2002.

Tezuka et al., "*Fabrication of strained Si on an ultrathin SiGe-on-insulator virtual substrate with a high-Ge fraction*", Applied Physics Letters, vol. 79, No. 12, Sep. 17, 2001, pp. 1798-1800.

Tezuka et al., "*Fabrication of a strained is on sub-10-nm-thick SiGe-on-insulator virtual substrate*", Materials Science and Engineering B89 (2002), pp. 360-363.

Tezuka et al., "*Novel fully-depleted SiGe-on-insulator pMOSFETs with high-mobility SiGe surface channels*", International Electron Devices Meeting Technical Digest, pp. 946-948, 2001.

Cannon, D. et al., "*Tensile strained epitaxial Ge films on Si(100) substrates with potential application in L-band telecommunications*", Applied Physics Letters, vol. 84, No. 6, Feb. 9, 2004, pp. 906-908.

Colace, L. et al., "*Efficient high-speed near-infrared Ge photodetectors integrated on Si substrates*", Applied Physics Letters, vol. 76, No. 10, Mar. 6, 2000, pp. 1231-1233.

Colace, L. et al., "*Ge-on-Si Approaches to the Detection of Near-Infrared Light*", IEEE Journal of Quantum Electronics, vol. 35, No. 12, Dec. 1999, pp. 1843-1852.

Fama, S. et al., "*High performance germanium-on-silicon detectors for optical communications*", Applied Physics Letters, vol. 81, No. 4, Jul. 22, 2002, pp. 586-588.

Hull, R., "Metastable strained layer configuration in the SiGe/Si system", (1999) *EMIS Datareviews, Series No. 24: Properties of SiGe and SiGe:C*, edited by Erich Kasper et al., INSPEC (2000), London, UK, pp. 21-41.

Ishikawa, Y. et al., "*Strain-induced band gap shrinkage in Ge grown on Si substrate*", Applied Physics Letters, vol. 82, No. 12, Mar. 31, 2003, pp. 2044-2046.

Lee et al., "*Growth of strained Si and Strained Ge heterostructures on relaxed $Si_{1-x}G_{ex}$ by ultrahigh vacuum chemical vapor deposition*", J. Vac. Sci. Technol. B 22(1) (Jan./Feb. 2004), pp. 158-164.

Li, Q, et al., "*Selective growth of Ge on Si(100) through vias of $SiO_2$ nanotemplate using solid source molecular beam epitaxy*", Applied Physics Letters, vol. 83, No. 24, Dec. 15, 2003, pp. 5032-5034.

Liu, J. et al., "*Silicidation -induced band gap shrinkage in Ge epitaxial films on Si*", Applied Physics Letters, vol. 84, No. 5, Feb. 2, 2004, pp. 660-662.

Masini, G. et al.; "*High-Performance p-i-n Ge on Si Photodetectors for the Near Infrared: From Model to Demonstration*", IEEE Transactiona of Electron Devices, vol. 48, No. 6, Jun. 2001, pp. 1092-1096.

Schollhorn et al., "*Coalescence of germanium islands on silicon*", Thin Solid Films, vol. 336 (1998), pp. 109-111.

* cited by examiner

SIGE RECTIFICATION PROCESS

REFERENCE TO RELATED APPLICATIONS

The present application claims priority under 35 U.S.C. §119 to U.S. Provisional Application No. 60/454,851, filed Mar. 12, 2003.

BACKGROUND OF THE INVENTION

1. Field of the Invention

This invention relates generally to the manufacturing of SiGe films, such as those used for integrated circuit fabrication. More particularly, the invention relates to methods for producing thin strain relaxed SiGe buffer layers.

2. Description of the Related Art

Relaxed SiGe buffer layers are used to produce strained silicon films on various substrates, including bulk silicon wafers and silicon-on-insulator ("SOI") wafers. These SiGe buffer layers are typically relatively thick, especially on bulk silicon wafers. The defect density in the SiGe is often difficult to control, particularly at high Ge concentration.

Strained semiconductor materials advantageously provide improved electrical carrier mobility properties as compared to relaxed semiconductor materials, thus increasing the speed at which semiconductor circuits can operate. A semiconductor layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions normally occupied when the material is deposited over an underlying structure having a matching lattice structure. Depending on the thickness of the strained layer, the degree of strain is related to several factors, including the thickness of the deposited layer and the degree of lattice mismatch between the deposited material and the underlying structure.

Strained semiconductor layers can be formed by epitaxially depositing silicon over a strain-relaxed silicon germanium layer. Silicon germanium (hereinafter "SiGe") films are used in a wide variety of semiconductor applications, such as in microelectronics fabrication. Because SiGe has a larger lattice constant than silicon, when epitaxial SiGe deposition occurs over silicon (such as during deposition on a silicon wafer), the epitaxially deposited SiGe is "strained" to the smaller underlying silicon lattice. If a strained silicon layer is to be deposited over the SiGe layer, the SiGe layer should first be "relaxed" to its natural lattice constant so that the silicon layer deposited thereover will be strained. In particular, because a strained SiGe layer has the dimensions of the underlying silicon lattice, a silicon layer deposited over a strained SiGe layer will not be strained. In contrast, a silicon layer deposited over a strain-relaxed SiGe layer will be strained to conform to the larger underlying SiGe lattice. Thus, a strained silicon layer can be produced by epitaxially depositing silicon over a relaxed SiGe layer.

As the thickness of a strained SiGe layer increases beyond a "critical thickness," defects in the crystal structure of the strained SiGe layer appear, thereby inducing relaxation. The critical thickness depends on a variety of factors, including growth rates, temperature, the degree of lattice mismatch, which is determined by the germanium concentration, and the number of defects within the layer underlying the SiGe layer. Unfortunately, relaxation is often accompanied by vertically propagating threading dislocations, which can adversely affect device operation.

To improve device performance, a trend is developing for replacing conventional "bulk" silicon wafers with so-called silicon-on-insulator ("SOI") wafers. The advantage of SOI technology is that the silicon in which transistors are made is not in electrical contact with the remainder of the wafer, such that no cross-talk among transistors takes place through the wafer bulk. The transistors are more effectively electrically isolated from one another.

SOI technology typically employs a thin (e.g., about 100 nm) insulating layer between the active semiconductor layer and the wafer, across the entire wafer or at least in those areas where active devices will be formed in the semiconductor layer. Silicon oxide, silicon nitride, or a combination of the two are typically employed as the insulating layer. These materials are amorphous, have excellent electrical properties, and the technology for integrating silicon nitride and/or silicon oxide is very well developed.

Two conventional technologies have been developed forming the SOI structures. One technology, known as SIMOX, starts with a semiconductor structure such as a silicon wafer and employs high energy implantation of oxygen atoms to form an oxide layer greater than about 100 nm below the surface of the silicon wafer. High temperature annealing then forms a buried silicon oxide, and at the same time repairs crystal defects in the surface silicon that are created by implantation. The surface silicon remains a semiconductor material, and the crystal structure thereof is restored by the annealing process. These steps are rather expensive, however, and the quality of the insulating layer and the active silicon thereover is somewhat compromised.

Another method for forming SOI structures is based on bonding a sacrificial silicon wafer onto an oxidized silicon wafer. By grinding or other thinning process, the sacrificial silicon wafer is reduced to a very thin, active semiconductor layer over the oxide from the other substrate. The thinning process, however, is critical to achieving high quality in the SOI structure, since the ultimately desired thickness uniformity of the active semiconductor layer is about 5 nm±0.1 nm. Furthermore, the bonding and thinning processes are complicated and rather expensive.

Strained silicon and SOI are complementary technologies and several attempts have been made to fabricate SiGe-On-Insulator (SGOI) substrates.

An attractive method to obtain SiGe on bulk silicon or an SOI substrate is to epitaxially deposit a strained SiGe layer, keeping the thickness and the Ge concentration below values at which the film relaxes. The SiGe film is then oxidized in such a way as to selectively oxidize the silicon, thereby extracting the silicon from the SiGe film. As a result, the Ge is concentrated in the remainder of the film. This has been found to result in a controlled relaxation of the SiGe, with a relatively low number of threading dislocations. See, for example, Takagi et al. Materials Sci. and Eng. B89:426–434 (2000). However, as the oxidation process consumes the silicon from the top of the structure, the germanium concentration below increases, creating a higher concentration of Ge in the remaining SiGe film near the top of the structure. As a result, most of the dislocations occur near the top of the film, which can lead to defective formation of the subsequently deposited strained silicon layer.

SUMMARY OF THE INVENTION

According to one aspect of the present invention, a method is provided for forming a strain-relaxed SiGe layer on a substrate. In a preferred embodiment, the method comprises depositing a reverse graded strained SiGe layer onto a substrate, the reverse graded SiGe film having a lower surface in contact with the substrate and an upper surface, wherein a first Ge concentration at the lower surface is greater than a second Ge concentration at the upper surface. The reverse graded SiGe film is oxidized to produce a strain-relaxed SiGe layer.

In the reverse graded SiGe film, the first Ge concentration is preferably in the range of about 20 atomic % to about 50 atomic % prior to oxidizing. More preferably the first Ge concentration is about 40 atomic % prior to oxidizing. The second germanium concentration is preferably in the range of about 0 atomic % to about 10 atomic % prior to oxidizing, more preferably about 0 atomic %.

The reverse graded SiGe layer is preferably oxidized by exposure to an oxidizing agent, such as water or oxygen. In some embodiments oxidizing comprises dry oxidation, while in other embodiments oxidizing comprises wet oxidation.

After oxidizing, the Ge concentration in the strain-relaxed SiGe layer preferably varies by less than about 5% between the upper and lower surfaces.

In one embodiment the substrate is a single-crystal silicon substrate. The single-crystal silicon substrate may further comprise an epitaxial silicon layer. In another embodiment the substrate is an SOI substrate.

According to another aspect of the invention, a method of forming a strained silicon layer on a substrate is provided. A strained SiGe layer comprising a top and a bottom is deposited on the substrate, such as a bulk silicon wafer or an SOI substrate. The substrate optionally comprises an epitaxial silicon layer. The strained SiGe layer is oxidized resulting in a silicon oxide layer over a strain-relaxed SiGe layer. The oxide is removed, for example by wet etching and a strained silicon layer is deposited over the strain-relaxed SiGe layer.

In one embodiment the Ge concentration increases from the top of the SiGe layer to the bottom of the SiGe layer prior to oxidizing.

Preferably, oxidizing comprises exposing the SiGe layer to an oxidizing agent, such as water or oxygen. In one embodiment oxidizing comprises exposing the substrate to an oxidizing agent at a temperature between about 850° C. and about 1150° C. Oxidizing may comprise dry oxidation or wet oxidation.

According to a further aspect of the invention, a method is provided for forming a strain-relaxed SiGe layer on a substrate in which the concentration of Ge is highest close to the interface with the substrate. A strained SiGe layer is preferably deposited onto the substrate, the SiGe layer comprising a lower surface in contact with the substrate and an upper surface. The germanium concentration at the lower surface is preferably greater than the germanium concentration at the upper surface prior to oxidation. The strained SiGe layer is oxidized under conditions that cause the layer to relax to the lattice constant of SiGe, while a higher concentration of germanium at the substrate interface is maintained.

These and other embodiments are described in greater detail below.

BRIEF DESCRIPTION OF THE DRAWINGS

These and other aspects of the invention will be readily apparent from the following description and from the appended drawings, which are meant to illustrate and not to limit the invention, and wherein.

DETAILED DESCRIPTION OF THE PREFERRED EMBODIMENT

Figure 1:
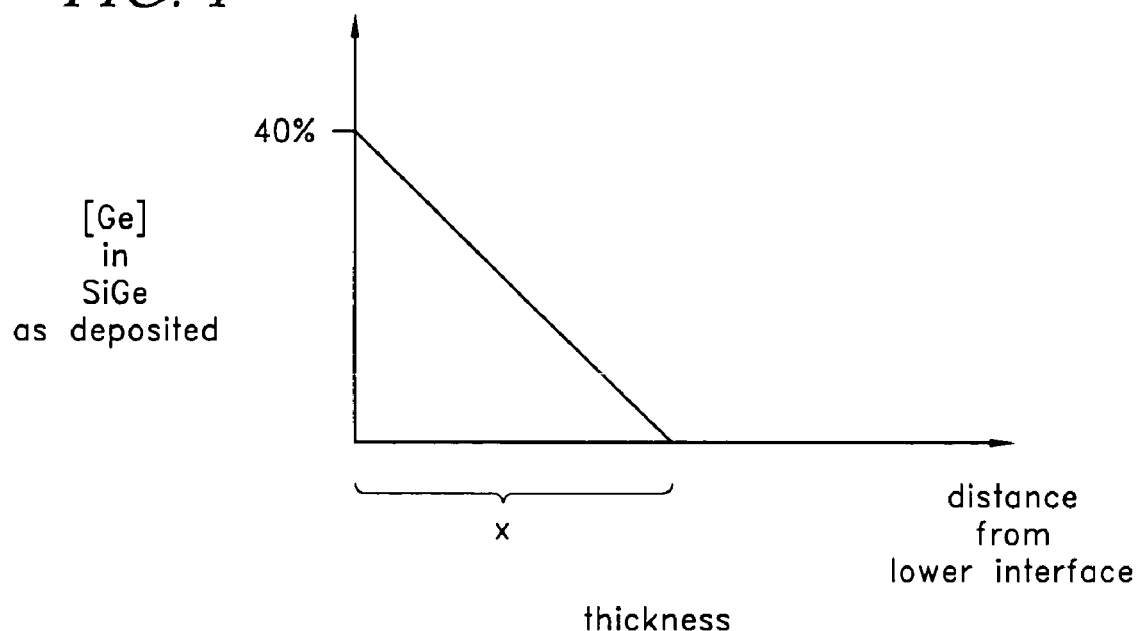
FIG. 1 illustrates the Ge concentration as a function of thickness in a reverse graded SiGe layer.

Methods have now been discovered for making relaxed SiGe films having a relatively low number of vertically propagating or threading dislocations. In preferred embodiments, a reverse graded strained SiGe film is oxidized to at least partially "rectify" the gradation of the film, so that the resulting strain-relaxed SiGe film has a more even distribution of Ge than the reverse graded SiGe film from which it was formed. This avoids the formation of a higher concentration of Ge at the top of the layer. Rather, the resulting Ge concentration is relatively even throughout the layer and most of the misfit dislocations occur at the substrate/SiGe interface rather than near the interface of the SiGe layer with a subsequently deposited strained silicon layer.

Although generally described below in terms of the formation of a relaxed SiGe layer on a bulk silicon substrate, one of skill in the art will recognize that the methods described herein can be applied to other contexts, such as the formation of relaxed SiGe layers on SOI substrates.

The use of graded SiGe layers is well-known in the art. However, these layers are typically graded from a low concentration of germanium at the substrate interface to a higher concentration of germanium at the top of the layer. In contrast, a reverse graded SiGe layer is utilized in the preferred methods. As used herein, a "reverse graded" SiGe layer is one in which the Ge concentration at the bottom of the film (near the substrate interface) is higher than the Ge concentration at the top of the film.

In the preferred embodiment, a reverse graded SiGe film is deposited onto a substrate. A "substrate" is a single crystal structure, such as a bulk silicon wafer, an SOI substrate, or a substrate comprising an epitaxial silicon layer. The thickness of the reverse graded SiGe layer is kept below the critical thickness so that strain is maintained. The SiGe film is then subject to oxidizing conditions. As the reverse graded SiGe film is oxidized, the silicon at the top is selectively removed, thus increasing the relative concentration of Ge at the top of the SiGe film and thereby decreasing the difference in Ge concentration between the top and the bottom of the film.

Preferably, the SiGe film thickness, reverse gradation profile and oxidation parameters are selected so that a given oxidation process results in a SiGe film with a substantially uniform germanium concentration as reflected by a relatively flat gradation profile at the end of the oxidation process. A substantially uniform germanium concentration is one in which the concentration of germanium varies by less than about 5%, more preferably by less than about 1% across the thickness of the SiGe film. However, in some embodiments it is desirable to maintain the highest germanium concentration at the substrate/SiGe interface.

Heteroepitaxial deposition of a reverse graded SiGe film on a substrate may be accomplished by any method known in the art. Well known methods exist for such heteroepitaxy, ranging from batch, furnace-based low pressure CVD (LPCVD) to single-wafer, cold-wall chamber based rapid thermal chemical vapor deposition (RTCVD) processes. These deposition processes may employ any of a number of silicon precursors, germanium precursors and carrier gases and may be performed under a variety of pressures, flow rates and temperatures. For example, SiGe may be deposited by CVD from a silicon precursor and a germanium precursor. Preferred silicon precursors include, without limitation, silane, disilane, trisilane, dichlorosilane, trichlorosilaneor and tetrachlorosilane. Germanium precursors include, without limitation, $GeH_4$ and digermane. Other silicon and germanium precursors that may be used will be apparent to one of skill in the art and the skilled artisan will be able to select optimum deposition conditions for a particular application without undue experimentation.

The SiGe film is preferably heteroepitaxially deposited such that the SiGe film is strained. A reverse graded film is formed by decreasing the concentration of germanium deposited as the deposition proceeds. This may be accomplished, for example, by decreasing the relative proportion of germanium precursor flow during deposition and/or by adjusting the deposition temperature.

While the SiGe gradation profile prior to oxidation may have various shapes, in preferred embodiments the shape reflects a Ge concentration at the bottom of the film that is higher than the Ge concentration at the top of the film and preferably high enough that relaxation misfit dislocations tend to form and propagate near the bottom of the film. That is, prior to oxidation the as-deposited SiGe film has a higher Ge concentration at the interface between the SiGe film and the substrate than at the top of the film. In one embodiment, the gradation profile is essentially linear, as illustrated in FIG. 1.

Preferably, at the substrate/SiGe interface the SiGe layer comprises between about 20% and about 50% Ge. In one embodiment the Ge concentration of the SiGe film at the substrate/SiGe interface is greater than or equal to about 20% Ge, more preferably greater than or equal to about 30% Ge, yet more preferably greater than or equal to about 40% Ge. In the illustrated embodiment the SiGe film comprises about 40% Ge at the substrate/SiGe interface (FIG. 1). While the Ge concentration at the substrate/SiGe interface is typically less than about 50%, higher concentrations are possible.

The Ge concentration at the surface of the SiGe film is preferably lower than the Ge concentration at the substrate/SiGe interface, and may be as low as zero, as illustrated in FIG. 1. In one embodiment the SiGe film comprises between about 0% and about 10% Ge at the surface. Again, the grading profile, including the concentration of Ge at the SiGe substrate interface and at the upper surface of the SiGe film, is preferably selected such that after oxidation the SiGe film will have a relatively flat gradation profile indicative of a substantially uniform Ge concentration. One of skill in the art will be able to optimize the initial gradation profile without undue experimentation.

Figure 2:
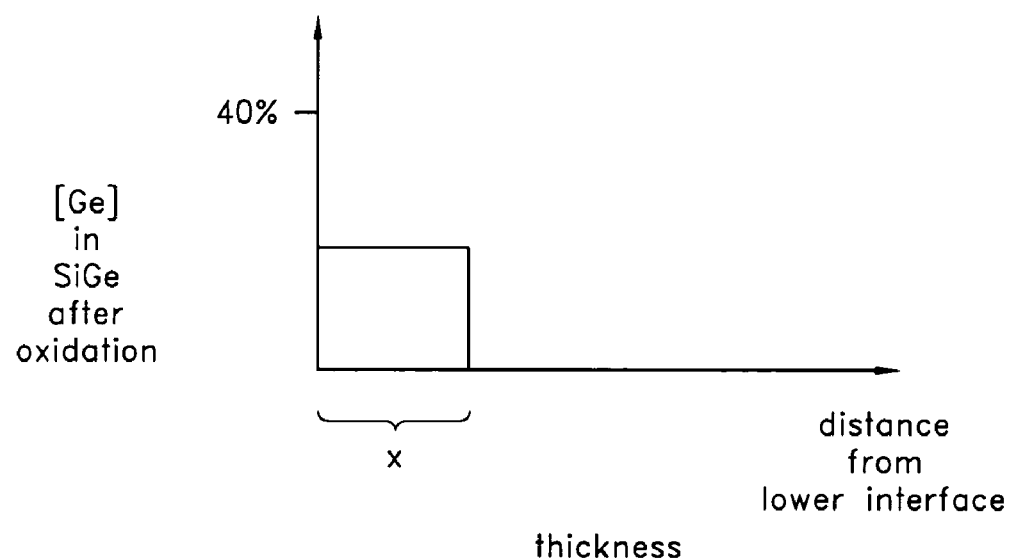
FIG. 2 illustrates the Ge concentration in the resulting SiGe as a function of thickness following oxidation of the reverse graded SiGe layer.

As discussed above, after deposition the graded SiGe layer is oxidized. Oxidation conditions are preferably selected that result in a relaxed SiGe layer with relatively flat Ge concentration profile (FIG. 2). Preferably oxidation is accomplished by exposing the substrate to an oxidizing environment. Any oxidant known in the art may be used, preferably water or oxygen.

In a preferred embodiment, oxidation of the reverse graded SiGe film leads to diffusion of Ge throughout the layer, resulting in more uniform distribution of germanium throughout the SiGe layer, producing a flatter overall gradation profile, as illustrated in FIG. 2. In addition in some embodiments oxidation is carried out at a temperature such that Ge will also diffuse from the SiGe film into the underlying substrate, resulting in movement of the substrate/SiGe interface. By controlling the oxidation conditions, the ultimate location of the interface, the Ge concentration and the thickness of the SiGe layer can be controlled.

The oxidation conditions lead to concentration of the Ge in the SiGe layer, thereby decreasing the critical thickness for relaxation. As a result, one of skill in the art will preferably select a thickness and gradation profile for the initially deposited film, such that following oxidation the SiGe layer will exceed its critical thickness and will relax. An oxidation temperature is selected that enables the desired degree of oxidation and therefore the desired final germanium concentration and thickness of the SiGe film. In addition, the thermal energy provided by the oxidation temperature may contribute to relaxation of the SiGe film. If desired, a temperature can be selected that will contribute to relaxation in this way.

Oxidation is preferably carried out at a temperature between about 850° C. and about 1150° C. The oxidation may be wet oxidation or dry oxidation. In one embodiment, oxidation is carried out using oxygen at a temperature of greater than about 900° C., more preferably greater than about 1000° C., even more preferably greater than about 1100° C. and yet more preferably at about 1150° C.

Oxidation is preferably carried out for a sufficient time to produce a uniform germanium distribution in a SiGe layer of the desired thickness, as may be readily determined by one of skill in the art through routine experimentation.

At lower oxidation temperatures, the amount of Ge diffusion is reduced. Thus, it is possible to maintain the highest germanium concentration at the substrate/SiGe interface during relaxation. For example, if half of the initial SiGe layer is oxidized and almost no germanium is lost in the oxidation process, it is possible to have a substantially flat Ge concentration profile for a large portion of the film from the top down, while still having the highest Ge concentration at the substrate/SiGe interface. The substrate/SiGe interface preferably acts as a medium for propagation of the dislocations such that the top part of the film contains fewer dislocations than the lower part. Preferably the top of the SiGe layer is essentially dislocation free.

The combination of (a) a non-flat gradation profile in the as-deposited graded SiGe film (which provides a higher concentration of Ge at the interface), and (b) an oxidation process in which the process parameters (time, temperature, etc.) are tuned to selectively oxidize the silicon in the upper part of the film to flatten the gradation profile, together produce a SiGe film in which the location of the interface is controlled and the dislocations produced during relaxation are controlled and confined.

Extraction of the silicon and concentration of the germanium results in a thinner SiGe film compared to the SiGe film initially deposited. One of skill in the art can readily determine the thickness of the initial SiGe layer and the oxidation conditions necessary to produce a SiGe layer with the desired thickness and SiGe concentration, such that relaxation occurs at the oxidation temperature.

The oxidation process yields a $SiO_2$ layer on top of the SiGe layer. The thickness of the $SiO_2$ layer will be determined by the oxidation conditions. In a preferred embodiment, the SiO$_2$ layer is subsequently removed, such as by selective etching or CMP. In a preferred embodiment, a wet etch process is used. A strained silicon layer is preferably deposited over the relaxed SiGe layer by processes known in the art.

Figure 3:
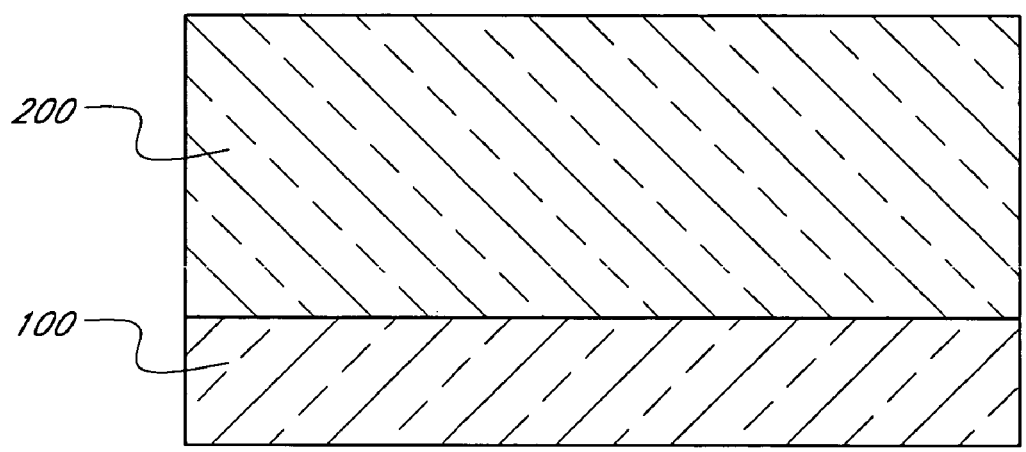
FIG. 3 illustrates a strained SiGe reverse graded layer formed on a bulk silicon substrate.
Figure 4:
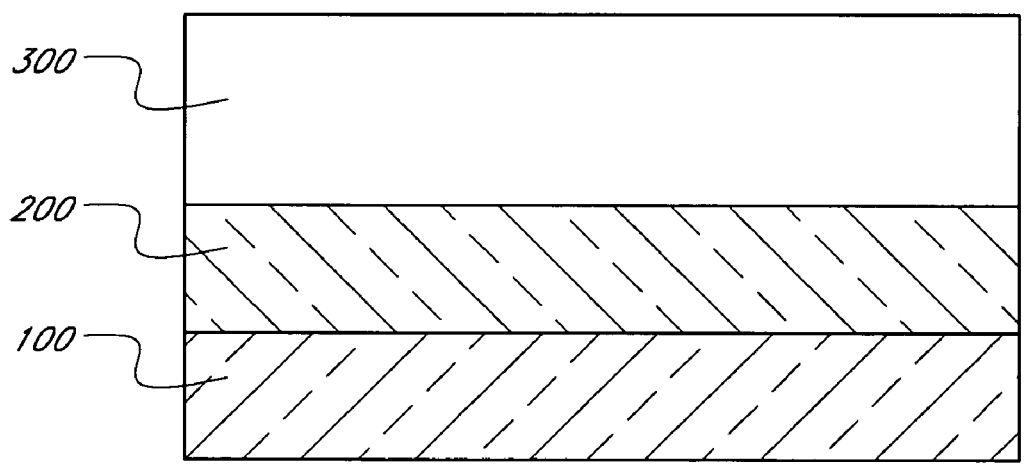
FIG. 4 illustrates the structure resulting from oxidation of the strained SiGe reverse graded layer, including a relaxed SiGe layer covered by a layer of silicon oxide.

FIG. 3 illustrates a bulk silicon substrate 100 on which a strained, reverse graded SiGe layer 200 has been epitaxially deposited. Exposure to oxidizing conditions leads to extraction of the silicon and formation of a silicon oxide layer 300 over the SiGe layer 200, as illustrated in FIG. 4. The thickness of the SiGe layer 200 is also reduced by the oxidation process. As discussed above, high temperature oxidation may cause germanium to diffuse from the SiGe layer 200 into the underlying silicon substrate 100.

Figure 5:
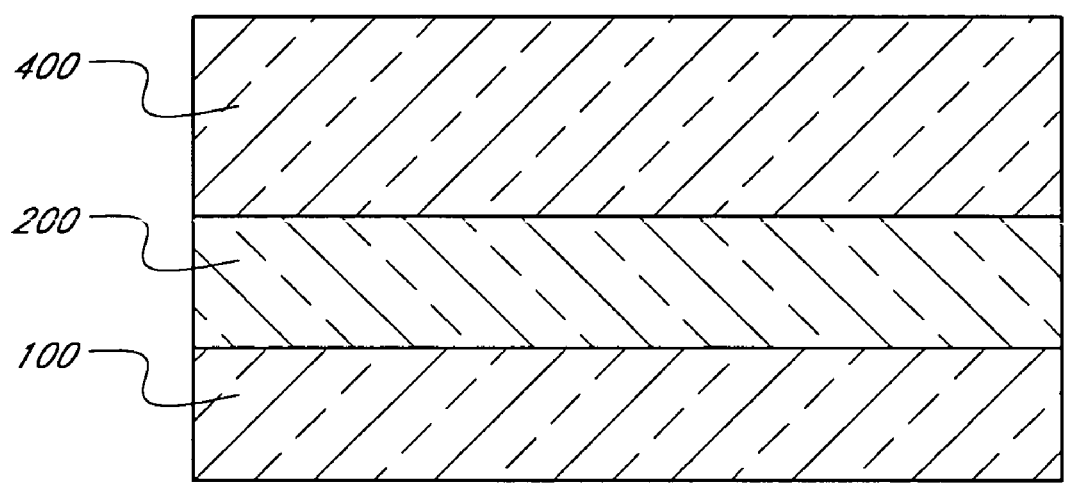
FIG. 5 illustrates a structure comprising a strained silicon layer over a strain-relaxed SiGe layer.

In a preferred embodiment, the silicon oxide layer 300 is removed, such as by wet etching and a strained silicon layer 400 is deposited on the SiGe layer 200 (FIG. 5).

It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A method for forming a strain-relaxed SiGe layer on a substrate comprising:
    depositing a reverse graded strained SiGe layer onto a substrate, the reverse graded SiGe layer having a lower surface in contact with the substrate and an upper surface, wherein a first Ge concentration at the lower surface is greater than a second Ge concentration at the upper surface; and
    oxidizing the reverse graded SiGe film to produce a strain-relaxed SiGe layer.

2. The method of claim 1, wherein the substrate comprises a single-crystal silicon substrate.

3. The method of claim 2, wherein the substrate further comprises an epitaxial silicon layer.

4. The method of claim 1, wherein the substrate is an SOI substrate.

5. The method of claim 1, wherein the first Ge concentration is in the range of about 20 atomic % to about 50 atomic % prior to oxidizing.

6. The method of claim 5, wherein the first Ge concentration is about 40 atomic % prior to oxidizing.

7. The method of claim 1, wherein the second Ge concentration is in the range of about 0 atomic % to about 10 atomic % prior to oxidizing.

8. The method of claim 7, wherein the second Ge concentration is about 0 atomic % prior to oxidizing.

9. The method of claim 1, wherein after oxidizing the Ge concentration in the strain-relaxed SiGe layer varies by less than about 5% between the lower surface and the upper surface.

10. The method of claim 1, wherein oxidizing comprises exposing the reverse graded SiGe film to an oxidizing agent.

11. The method of claim 10, wherein the oxidizing agent is selected from the group consisting of water and oxygen.

12. A method of forming a strained silicon layer on a substrate comprising:
    depositing a strained SiGe layer comprising a top and a bottom on the substrate, wherein the SiGe layer comprises a reverse graded Ge concentration;
    oxidizing the strained SiGe layer thereby forming a silicon oxide layer over a strain-relaxed SiGe layer;
    removing the oxide; and
    depositing a strained silicon layer over the strain relaxed SiGe layer.

13. The method of claim 12, wherein the substrate is a bulk silicon wafer.

14. The method of claim 13, wherein the substrate further comprises an epitaxial silicon layer.

15. The method of claim 12, wherein the substrate is an SOI substrate.

16. The method of claim 12, wherein the Ge concentration increases from the top to the bottom prior to oxidizing.

17. The method of claim 12, wherein oxidizing comprises exposing the substrate to an oxidizing agent.

18. The method of claim 17, wherein the substrate is exposed to an oxidizing agent at a temperature between about 850° C. and about 1150° C.

19. The method of claim 17, wherein the substrate is exposed to an oxidizing agent at a temperature greater than about 1000° C.

20. The method of claim 17, wherein the oxidizing agent is selected from the group consisting of water and oxygen.

21. The method of claim 12, wherein oxidizing comprises dry oxidation.

22. The method of claim 12, wherein oxidizing comprises wet oxidation.

23. The method of claim 12, wherein removing the oxide comprises wet etching.

24. A method for forming a strain-relaxed SiGe layer on a substrate comprising:
    depositing a strained SiGe layer onto a substrate, the SiGe layer having a lower surface in contact with the substrate and an upper surface, wherein a first Ge concentration at the lower surface is greater than a second Ge concentration at the upper surface; and
    oxidizing the SiGe film to produce a strain-relaxed SiGe layer wherein the concentration of Ge is highest at the lower surface.

25. The method of claim 24, wherein the Ge concentration decreases linearly from the first concentration to the second concentration prior to oxidizing.

* * * * *